United States Patent [19]

Pauly et al.

[11] Patent Number: 5,402,067
[45] Date of Patent: Mar. 28, 1995

[54] APPARATUS AND METHOD FOR RARE ECHO IMAGING USING K-SPACE SPIRAL COVERAGE

[75] Inventors: John M. Pauly, San Francisco; Daniel M. Spielman, San Jose; Craig H. Meyer, Palo Alto; Albert Macovski, Menlo Park; Norbert J. Pelc, Los Altos, all of Calif.

[73] Assignee: Board of Trustees of the Leland Stanford Junior University, Palo Alto, Calif.

[21] Appl. No.: 101,865

[22] Filed: Aug. 4, 1993

[51] Int. Cl.⁶ .................................... G01V 3/00
[52] U.S. Cl. .................................. 324/307; 324/309
[58] Field of Search ............... 324/300, 306, 307, 309, 324/314

[56] References Cited

U.S. PATENT DOCUMENTS

| | | | |
|---|---|---|---|
| 4,307,343 | 12/1981 | Likes | 324/307 |
| 4,642,567 | 2/1987 | Kaplan | 324/309 |
| 4,651,096 | 3/1987 | Buonocore | 324/309 |
| 4,748,410 | 5/1988 | Macovski | 324/309 |
| 5,122,747 | 6/1992 | Riederer | 324/309 |
| 5,309,101 | 5/1994 | Kim et al. | 324/309 |

OTHER PUBLICATIONS

Meyer et al., "Fast Spiral Coronary Artery Imaging," Magnetic Resonance in Medicine, vol. 28, pp. 202–213 (1992) month of pub. unknown.
Higuchi et al., "A Novel Method for Fat Supression in RARE Sequences," Magnetic Resonance in Medicine, vol. 27, pp. 107–117 (1992) month of pub. unknown.
Oshio et al., "Single-Shot GRASE Imaging without Fast Gradients," Magnetic Resonance in Medicine, vol. 26, pp. 355–360 (1992) month of pub. unknown.
Le Roux et al., "Stabilization of Echoes Amplitudes in RARE Sequences," Proceedings of the 11th SMRM, p. 4501 (1992) month of pub. unknown.
Jackson et al., "Selection of a Convolution Function for Fourier Inversion Using Gridding," IEEE Transactions on Medical Imaging, vol. 10, No. 3, pp. 473–478, Sep. 1991.
Pauly et al., "Parameter Relations for the Shinnar-Le Roux Selective Excitation Pulse Design Algorithm," IEEE Transactions on Medical Imaging, vol. 10, No. 1, pp. 53–65, Mar. 1991.
Melki et al., "Comparing the FAISE Method with Conventional Dual-Echo Sequences," JMRI, vol. 1, No. 3, pp. 319–326, May/Jun. 1991.
Meyer et al., "Developments in Spatial-Spectral Selective Excitation," Proceedings of the Ninth SMRM, p. 32 (1990).
Meyer et al., "Simultaneous Spatial and Spectral Selective Excitation," Magnetic Resonance in Medicine, vol. 15, pp. 287–304 (1990) month of pub. unknown.

(List continued on next page.)

*Primary Examiner*—Louis Arana
*Attorney, Agent, or Firm*—Townsend and Townsend Khourie and Crew

[57] ABSTRACT

A long train of spin echoes is produced using a RARE excitation pulse sequence, and during each spin echo an annular segment of a long k-space spiral as determined by read-out magnetic gradients is detected. At the end of the echo train the entire k-space spiral will have been covered. Each of the segments can be a unique annular portion of the k-space spiral. Alternatively, fewer annular segments of the spiral can be provided, with the fewer annular segments rotated in k-space and replayed to cover interleaved paths in k-space. The imaging gradients are refocused at the time of each spin-echo pulse in order to permit the long echo pulse trains of RARE imaging. Each spiral segment is surrounded by gradient lobes that move out from the k-space origin to the beginning of the segment, and move back to the origin from the end of the segment. Advantageously, the magnetic gradient lobes can be produced concurrently with parasitic echo crusher gradients at the beginning and end of each spin-echo pulse. Further, off-resonance effects can be placed in sidelobes of the spin-echo signal to facilitate suppression in the detected signals.

14 Claims, 9 Drawing Sheets

OTHER PUBLICATIONS

Mulkern et al., "Contrast Manipulation and Artifact Assessment of 2D and 3D RARE Sequences," Magnetic Rsonance Imaging, vol. 8, pp. 557–566 (1990) month of pub. unknown.

Ahn et al., "High-Speed Spiral-Scan Echo Planar NMR Imaging–I," IEEE Transactions on Medical Imaging, vol. MI–5, No. 1, pp. 2–7, Mar. 1986.

Hennig et al., "RARE Imaging: A Fast Imaging Method for Clinical MR," Magnetic Resonance in Medicine, vol. 3, pp. 823–833, 1986 month of pub. unknown.

O'Sullivan, "A Fast Sinc Function Gridding Algoritm for Fourier Inversion in Computer Tomography," IEEE Transactions on Medical Imaging, vol. MI–4, No. 4, pp. 200–207, Dec. 1985.

APPARATUS AND METHOD FOR RARE ECHO IMAGING USING K-SPACE SPIRAL COVERAGE

The U.S. Government has rights in the invention pursuant to NIH grants HL-39478, HL-39297, HL-34962, NCI-CA 50948, and NCI-CA 48269 with Stanford University.

BACKGROUND OF THE INVENTION

This invention relates generally to magnetic resonance imaging (MRI) and, more particularly the invention relates to detecting a long spin echo signal train using spiral k-space coverage.

Nuclear magnetic resonance (NMR) imaging, also called magnetic resonance imaging (MRI), is a nondestructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency $\omega_0$, of the precession of the nuclei is the product of the magnetic field $B_0$, and the so-called magnetogyric ratio, $\gamma$, a fundamental physical constant for each nuclear species:

$$\omega_o B_0 \cdot \gamma$$

Accordingly, by superimposing a linear gradient field, $B_z = Z \cdot G_z$, on the static uniform field, $B_0$, which defined Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclei spin flip in response to an RF pulse excitation proportional to the integral of the pulse over time.

Hennig et al., "RARE Imaging: A Fast Imaging Method for Clinical MR," Magnetic Resonance in Medicine 3, 823-833 (1986) discloses an RF pulse sequence for obtaining a pulse echo train for heavily $T_2$ weighted images in a single shot. Reordering the acquisitions and using multiple interleaved acquisitions produces very high quality images with contrast corresponding to arbitrary echo times. In order to return to single shot acquisition, Oshio et al., "Single Shot GRASE Imaging Without Fast Gradients," Magnetic Resonance in Medicine, 26(2):355-360, August 1992, disclose a GRASE RF pulse sequence which combines a RARE echo train with several gradient recalled echoes per RARE echo. This can be thought of as a hybrid between RARE and echo-planar imaging (EPI) which speeds up RARE, but off-resonance constraints restrict the effective echo times that can be produced.

The present invention is directed to a combination of RARE and Fast Spiral Imaging disclosed in Meyer et al., "Fast Spiral Coronary Artery Imaging," Magnetic Resonance in Medicine, 28(2):202-213, December 1992. This has several advantages since spirals very efficiently cover k-space. On conventional gradient systems the required data acquisition time is reduced compared to echo planar. Part of this reduction comes from not collecting the corners of k-space. The other part comes from not wasting time constantly doubling back as echo-planar does. Another major consideration is the suppression of off-resonance effects.

SUMMARY OF THE INVENTION

In accordance with the invention, a long train of spin echoes is produced using a RARE excitation pulse sequence, and during each spin echo an annular segment of a long k-space spiral as determined by read-out magnetic gradients is detected. At the end of the echo train, the entire k-space spiral will have been covered.

Each of the segments can be a unique annular portion of the k-space spiral. Alternatively, fewer annular segments of the spiral can be provided, with the fewer annular segments rotated in k-space and replayed to cover interleaved paths in k-space.

The imaging gradients are refocused at the time of each spin-echo pulse in order to permit the long echo pulse trains of RARE imaging. Each spiral segment is surrounded by gradient lobes that move out from the k-space origin to the beginning of the segment, and move back to the origin from the end of the segment. Advantageously, the magnetic gradient lobes can be produced concurrently with parasitic echo crusher gradients at the beginning and end of each spin-echo pulse. Further, off-resonance effects can be placed in sidelobes of the spin-echo signal to facilitate suppression in the detected signals.

The invention and objects and features thereof will be more readily apparent from the following description and appended claims when taken with the drawings.

DETAILED DESCRIPTION OF ILLUSTRATIVE EMBODIMENTS

Figure 1A:
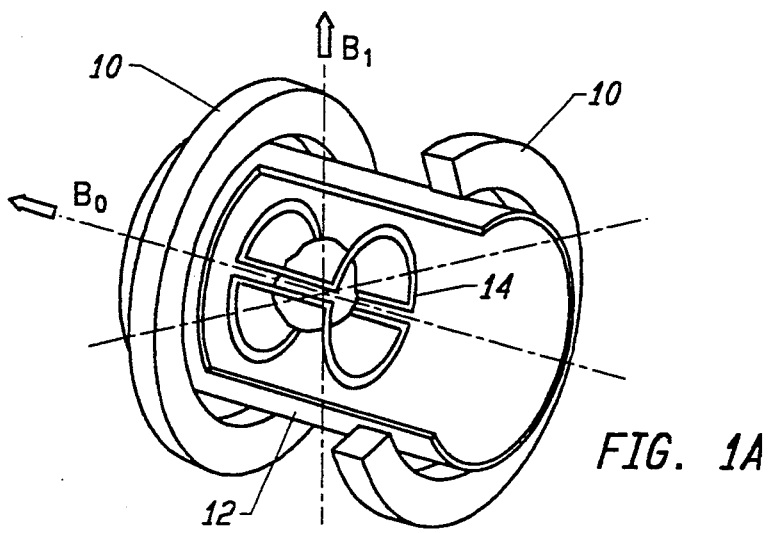
FIGS. 1A-1D illustrate the arrangement of MRI apparatus and magnetic fields generated therein.
Figure 1B:
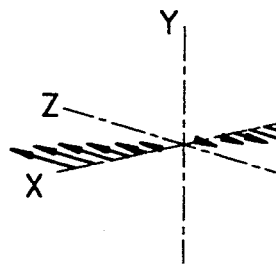
Figure 1C:
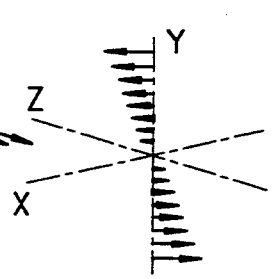
Figure 1D:
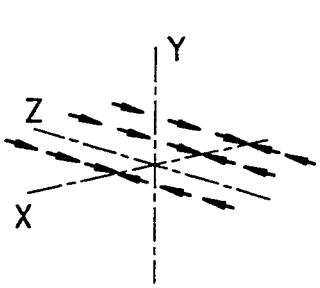

Referring now to the drawing, FIG. 1A is a perspective view partially in section illustrating coil apparatus in NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," Proceedings of the IEEE, Vol 71, No. 3, March 1983, pp. 338–350. Briefly, the uniform static field $B_0$ is generated by the magnet comprising the coil pair 10. A gradient field $G(x)$ is generated by a complex gradient coil set which can be wound on the cylinder 12. An RF field $B_1$ is generated by a saddle coil 14. An patient undergoing imaging would be positioned along the Z axis within the saddle coil.

In FIG. 1B an X gradient field is shown which is parallel to the static field $B_0$ and varies linearly with distance along the X axis but does not vary with distance along the Y or Z axes. FIGS. 1C and 1D are similar representations of the Y gradient and Z gradient fields, respectively.

Figure 2:
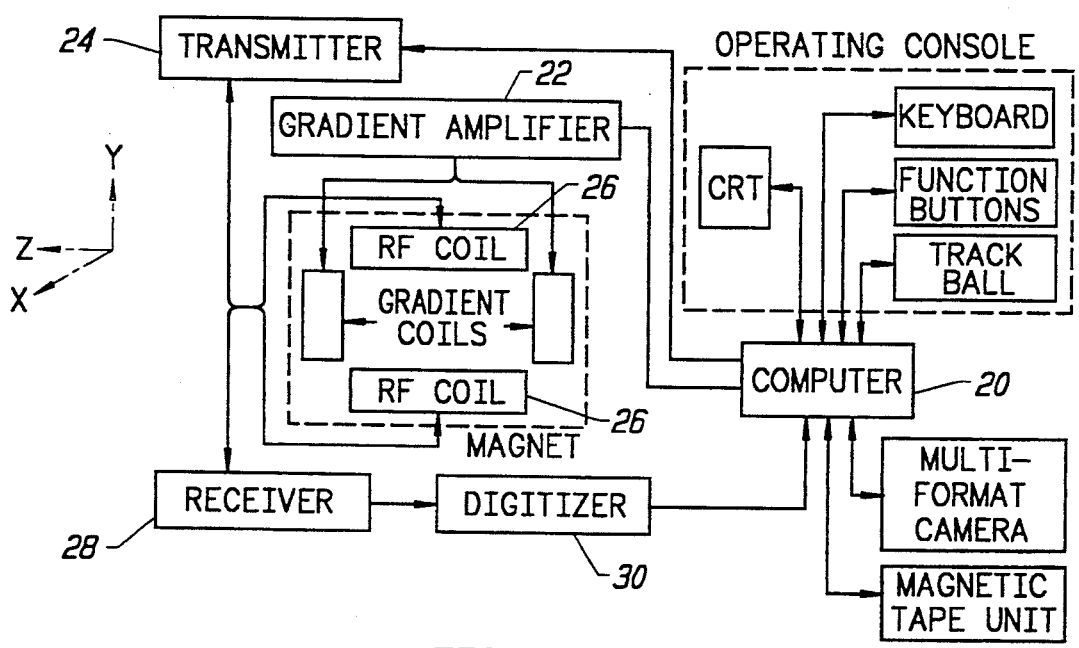
FIG. 2 is a functional clock diagram of MR imaging apparatus.

FIG. 2 is a functional block diagram of the imaging apparatus as disclosed in NMR—A Perspective on Imaging. General Electric Company, 1982. A computer 20 is programmed to control the operation of the NMR apparatus and process FID signals detected therefrom. The gradient field is energized by a gradient amplifier 22 and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

Figure 3:
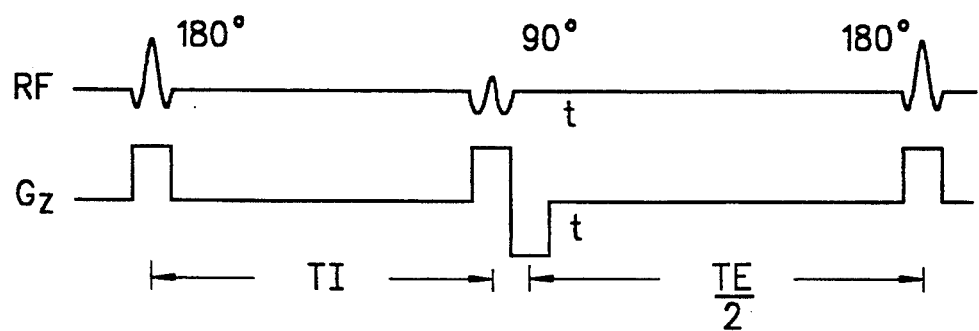
FIG. 3 illustrates a basic pulse sequence for exciting a slab for projection image.

FIG. 3 is a graph illustrating applied RF pulses for a 180° flip angle and a 90° flip angle followed by a "time reversal" 180° pulse and the associated Z axis magnetic field gradient applied during application of the RF pulses. The illustrated pulses are conventional sinc pulses which have front and back lobes with a main RF pulse therebetween.

Figure 4:
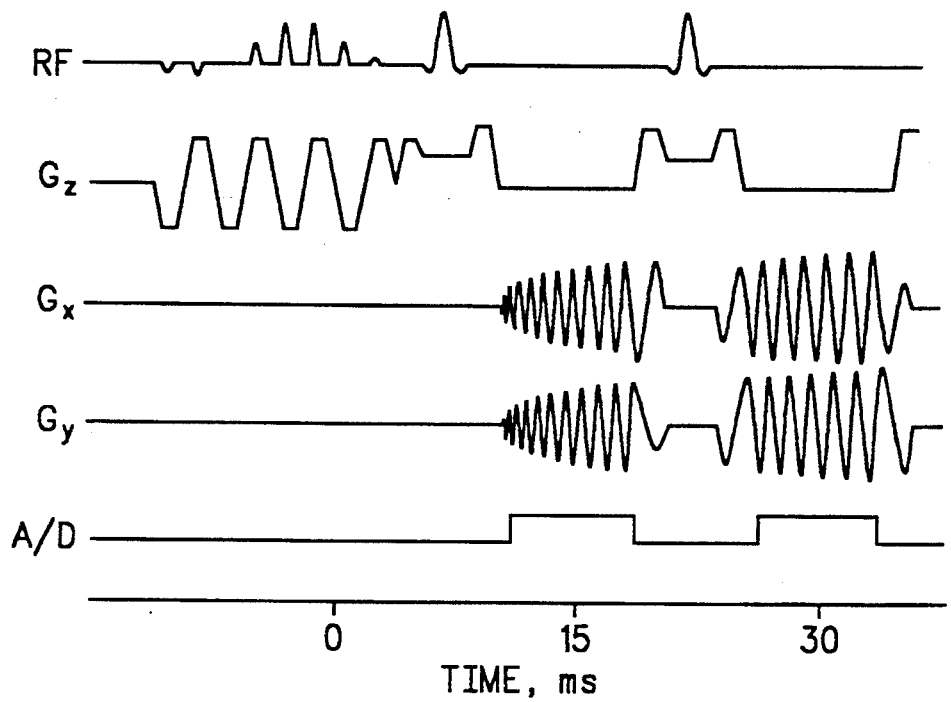
FIG. 4 illustrates an RF excitation pulse sequence and a magnetic gradient readout pulse sequence in accordance with the invention.

A single very long k-space spiral would be sufficient to reconstruct an image if the duration could be made long enough. On a 1.5T Signa system (GE Medical Systems, Milwaukee, Wis.) with 1 G/cm gradients and 2 G/cm/ms slew rates, a single 128 ms 64 turn spiral would allow the reconstruction of a 128 by 128 image over a 32 cm field of view (FOV). Unfortunately, off-resonance effects limit the useful acquisition time to 10–20 ms. In accordance with the invention, the off-resonance effects are periodically refocused. A single very long spiral is partitioned into a number of shorter annular segments. As in RARE, a long train of refocusing pulses is used to produce spin-echoes. During each spin echo one of the spiral segments is played out and data collected. By the end of the echo train the entire spiral has been collected. The first part of the pulse sequence is illustrated in FIG. 4.

Figure 6:
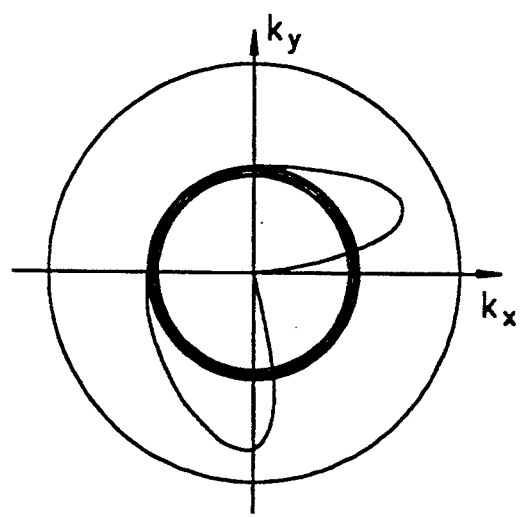
FIG. 6 illustrates k-space coverage of an intermediate spiral segment.
Figure 5B:
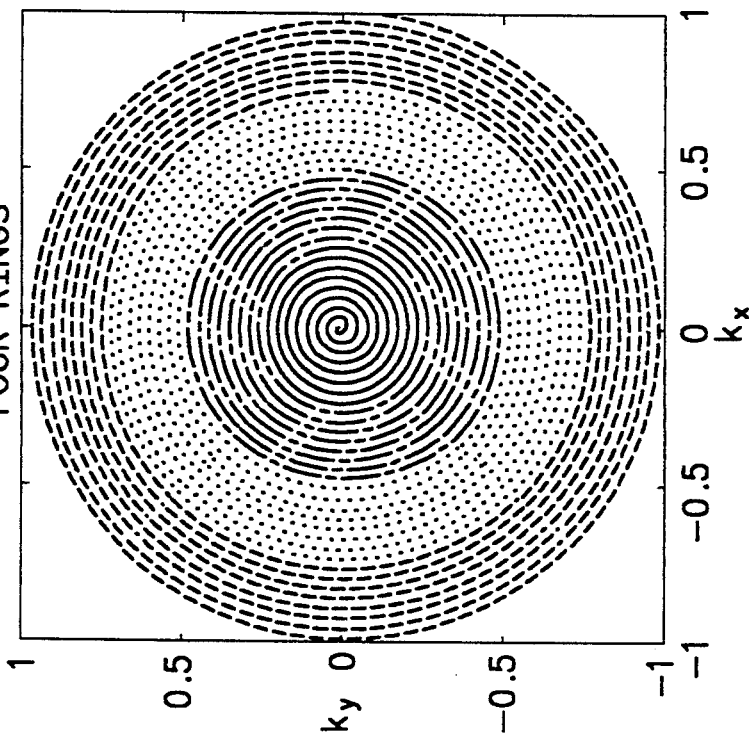
FIGS. 5A and 5B illustrate conventional interleaved k-space spirals and annular spiral segments as used in the invention.
Figure 5A:
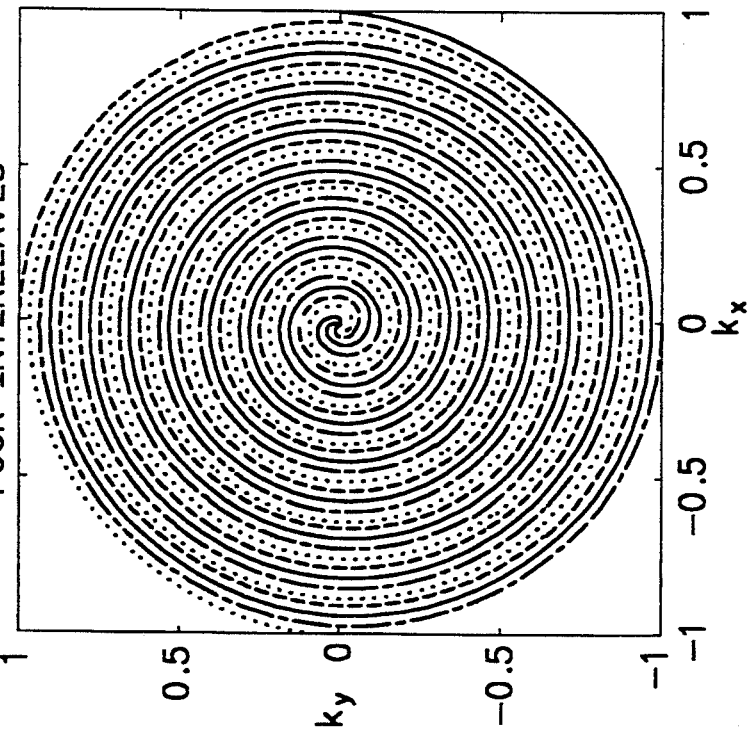
Figure 7A:
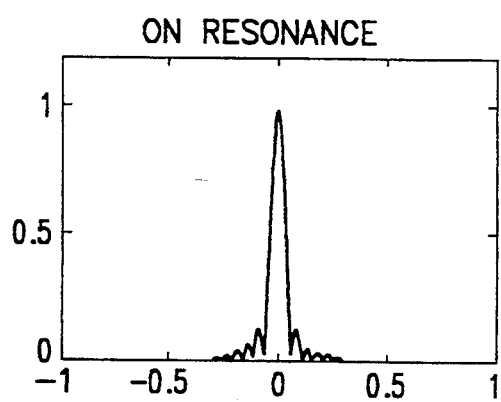
FIGS. 7A-7D illustrate interleaved spiral off-resonance point spread function.
Figure 7B:
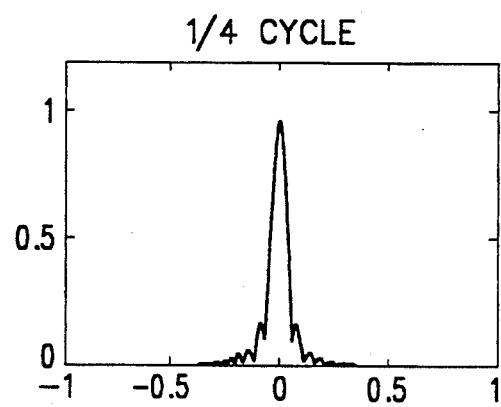
Figure 7C:
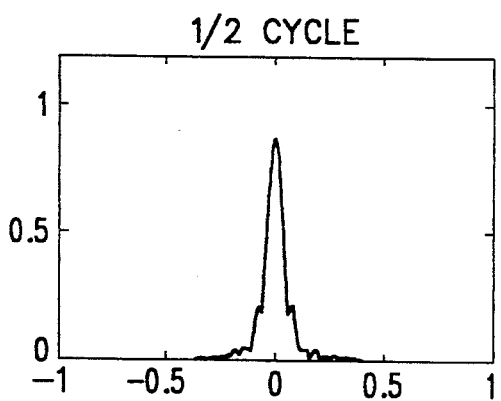
Figure 7D:
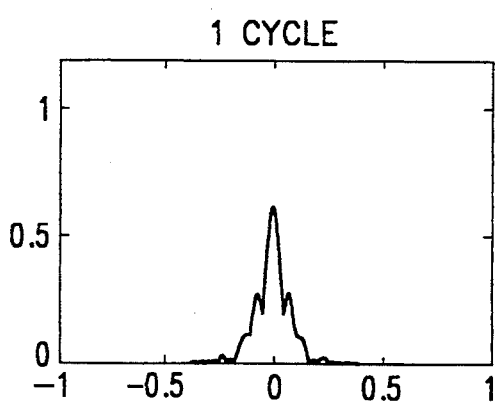
Figure 8A:
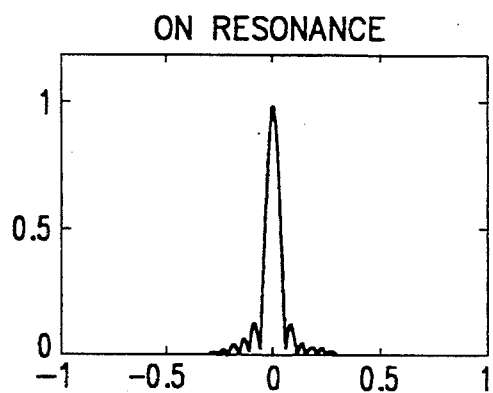
FIGS. 8A-8D illustrate spiral annular ring off-resonance point spread function.
Figure 8B:
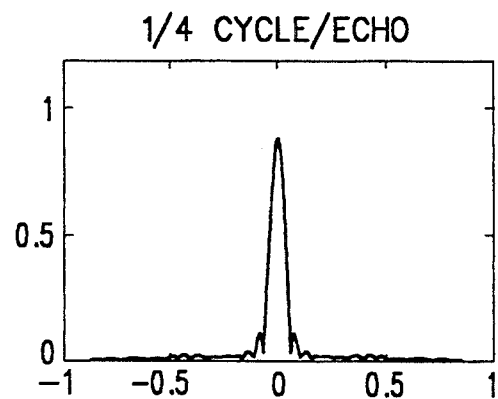
Figure 8C:
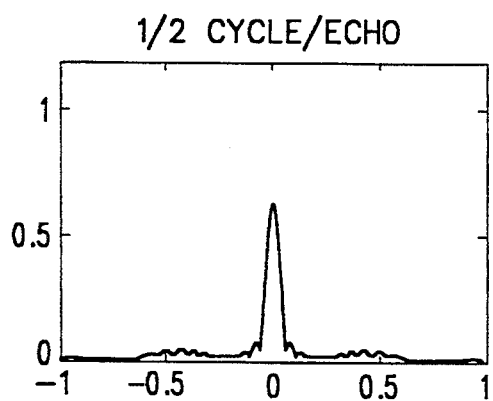
Figure 8D:
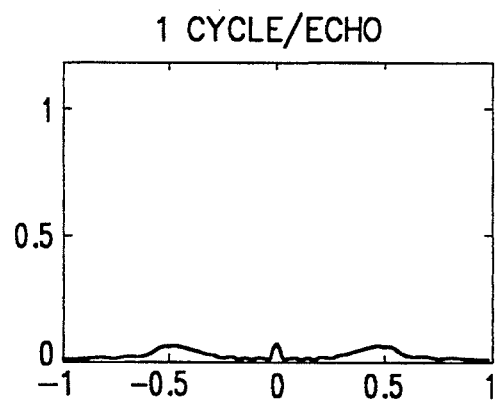

FIG. 5A illustrates conventional interleaved k-space spirals, and FIG. 5B illustrates four annular segments of a k-space spiral as used in the invention. There are several important design considerations for the RARE-Spiral pulse sequence. First, the imaging gradients should be refocused at the time of each spin-echo pulse into order to preserve the CPMG condition that is critical for RARE to produce long echo trains. This means that each spiral segment must be surrounded by gradient lobes that move out from the origin to the beginning of the segment, and back to the origin from the end of the segment. There is no loss in echo detection time because these lobes can be played coincidentally with the crusher gradients surrounding the spin-echo pulses. FIG. 6 is a plot of the k-space trajectory for one spiral segment showing the annular region it covers, along with the transfers to and from the origin.

An important consideration is the effect of off-resonance on this type of k-space trajectory. With a single spiral off-resonance blurring is a local phenomenon. FIGS. 7A–7D show the point spread function (psf) for a single spiral trajectory with 0, $\frac{1}{4}$, $\frac{1}{2}$ and 1 cycle of off-resonance shift over their duration. The main effect is an increase in the main lobe width, which reduces the apparent image resolution. In addition the peak amplitude of the psf decreases, indicating a loss of signal.

The case of the spiral segments is different, in FIGS. 8A–8D for 0, $\frac{1}{4}$, $\frac{1}{2}$, and 1 cycle of off-resonance shift over each of eight spiral segments. The effect of the multiple refocusing pulses is to modulate the blurring so that it appears as sidelobes at a distance from the blurred object. There is no apparent loss of resolution, only a signal loss which increases with off-resonance frequency. Ultimately, when a full cycle of phase shift occurs over the duration of each segment (FIG. 8D) all the energy is in the sidelobes, and the object effectively disappears.

Figure 9A:
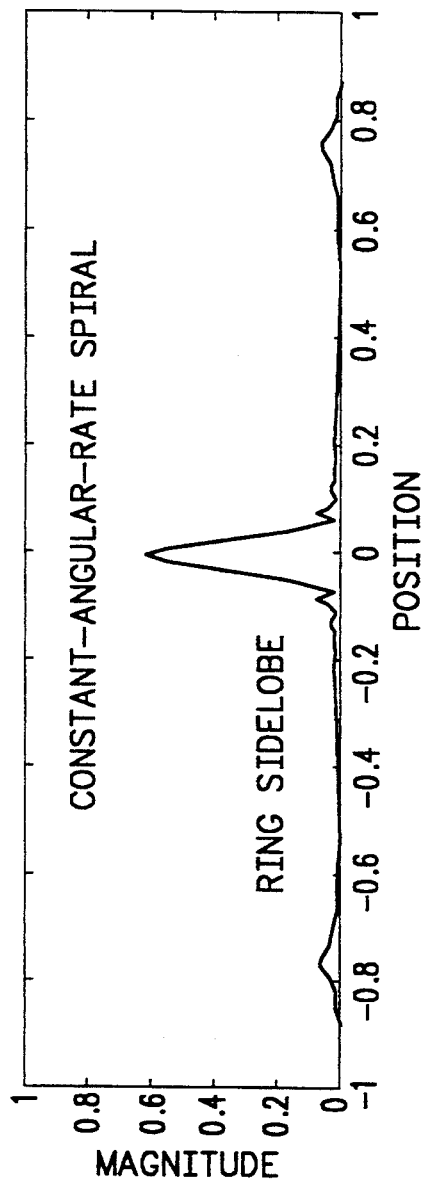
FIGS. 9A and 9B illustrate off-resonance sidelobes produced by constant angular rate and constant voltage spirals when divided into equal duration segments.
Figure 9B:
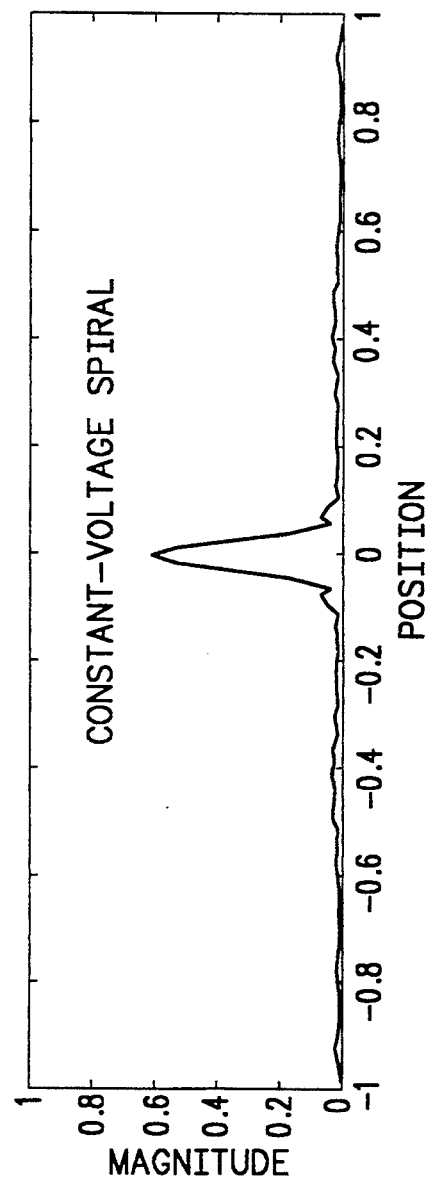

The nature of the sidelobes produced by the off-resonance blurring depends on the type of the original spiral and on the way it is split into segments. If a constant angular rate spiral is split into segments of equal duration, most of the sidelobe energy ends up single coherent ring, illustrated in FIG. 9A. In practice the spiral gradients are optimized to meet hardware constraints and minimize the data acquisition time. When an optimized spiral is split into equal duration segments the number of spiral cycles in each segment varies. The inner segment will have the most cycles while the outer the least. In this case the off-resonance sidelobes are dispersed, as shown in FIG. 9B.

A major concern is the presence of fat in the image. The 3.4 ppm lipid shift is far outside the $\pm \frac{1}{2}$ cycle/echo off-resonance tolerance of the pulse sequence, unless the acquisitions are very short. There are several possible approaches. First is to use a spatial-spectral pulse for excitation. This is probably the cleanest approach since lipids are never excited. Another approach is the use of an initial inversion or excitation pulse to null the lipid signal at the time of the excitation. A third approach is to pull the 90° pulse back a quarter cycle at the lipid-water difference frequency, or about one millisecond at 1.5T. In this time lipids undergo a 90° phase shift relative to water, will be in the CP condition rather than the CPMG condition, and will decay away fairly rapidly. A final option is to let the off-resonance behavior of the segmented spiral suppress the lipid signal. The pulse sequence plotted in FIG. 4 uses a spectral spatial pulse, and shifts the center of the excitation back one millisecond.

One of the most important aspects of designing a pulse sequence that uses non-Cartesian sampling is choosing waveforms that conform to the capabilities of the gradient system. Otherwise the fidelity of the trajectory will degrade, the k-space coverage will not be uniform, and image artifacts will be produced. To a limited extent this can be corrected in the reconstruction if the actual gradient waveforms can be collected as they are applied to the gradient coil.

Given a spiral trajectory through k-space k(t), there are many possible gradient waveforms that will trace out this trajectory. All of these may be considered as time warped versions of a prototype trajectory, for example the constant-angular rate trajectory $$k(t) = k_{max} \frac{t}{T} e^{i2\pi Nt/T}$$

where $k(t) = k_x(t) + ik_y(t)$. The gradient waveforms for this trajectory are $$G(t) = \frac{k_{max}}{T}\left(1 + \frac{i2\pi Nt}{T}\right)e^{i2\pi Nt/T}$$

This gradient waveform has some undesirable features. During the initial part of the waveform the gradient amplitude and its rate of change (slew rate) are far below the capabilities of the gradient amplifiers. This part of the waveform could be played much more rapidly, reducing the A/D duration for echo detection and thus the effects of off-resonance blurring. In the prior art constant slew rate gradients have been used because they closely match the gradient capabilities of whole-body imaging machines. Other constraints, such as a gradient amplitude have also been proposed.

The RARE-Spiral hybrid in accordance with the invention has been implemented on both a 1.5 T Signa whole body imaging machine (GE Medical Systems, Milwaukee, Wis.) and a 4.7 T Omega CSI system (GE Instruments, Fremont, Calif., now Bruker). On the Signa, excellent gradient fidelity is maintained if we stay within the rated amplitude and slew rate constraints. The case of the 4.7T Omega is a little more complex. In this case the gradient system limit is the maximum voltage that the gradient amplifiers can apply across the terminals of a gradient coil. This voltage is divided between two terms. First is the current through the coil (proportional to the gradient) multiplied by the resistance of the coil. The second is the rate of change of the current (essentially the slew rate) multiplied by the inductance of the coil. If a designed gradient waveform exceeds this voltage the fidelity of the gradient suffers.

If we define $\tau(t)$ to be a time warping function, the k-space trajectory $k(\tau(t))$ can be numerically optimized to meet the gradient system hardware constraints. From optimized $k(\tau(t))$ the actual gradient waveforms are computed.

As an example, consider the implementation of the RARE-Spiral pulse sequence of the invention of a 1.5T Signa system. The goal is a pulse sequence that can form a 128 by 128 image in a single shot. A 64 turn spiral is needed to cover a disk in k-space that is 128 samples across. We start with a constant angular rate spiral, and set the maximum extent of k-space covered. The time-warping function $\tau(t)$ is then designed to meet the maximum gradient and slew rate constraints. This sets the overall spiral duration. In our case the maximum receiver bandwidth is ±64 kHz, which is a field of view (FOV) of 32 cm at the maximum gradient of 1 G/cm. If we choose $k_{max}$ for 128 samples over 32 cm, then the duration of the time-spiral becomes 128 ms. The slew rate is constant at 2 (G/cm)/ms, and the peak amplitude just reaches the limit of 1 G/cm at the end of the spiral.

The next step is to split the 128 ms spiral into equal length segments, each of which will be played during one of the RARE echoes. The length of each segment determines the degree of off-resonance sensitivity, with shorter segments giving greater tolerance to off-resonance. From FIG. 8 we can see that significant off-resonance effects are observable at one-half cycle over the duration of each acquisition. If we assume we want ±1 ppm tolerance to off-resonance, then each acquisition should be 8 ms. The 128 ms spiral is then broken up into 16 segments of 8 ms each.

This pulse sequence depends heavily on the ability of the underlying RARE echo sequence to maintain signal amplitudes over very long echo trains. This is critically dependent on the maintenance of the CPGM condition. To preserve this condition all of the image localizing gradients must be rewound before each refocusing pulse. This means that each annular segment must be preceded by a transfer gradient that moves from the origin of k-space out to the beginning of that particular segment. The transfer must match both the gradient amplitude and slew rate to insure the accuracy of the transfer. After the end of each segment another transfer gradient moves back into the k-space origin. The transfers are designed by fitting a third order polynomial that matches the boundary conditions and the 2 ms duration of the crusher gradients. The transfers for each gradient were designed independently. The amplitude and slew rates of the transfer gradients must be checked to see that they are within limits. If not, their duration must be increased. In this case, that was not necessary.

The other elements of the pulse sequence are all fairly standard. The excitation pulse is a minimum-phase spectral-spatial pulse designed to put the antisymmetric first sidelobe at the lipid frequency. This pulse has the same spatial profile as a time-bandwidth 4 pulse, and can achieve a minimum slice width of 7 mm. The refocusing RF pulses were designed with the Shinnar-Le Roux algorithm. Each is 3 ms long and has a time-bandwidth of 3 to keep the peak RF amplitude to 800 Hz. Peak in-slice and out-of-slice ripple is 1%. The recursive design method proposed by Le Roux and Hinks can be used in order to reduce signal variations due to slice profile changes during the echo train. The data collection interval is 8 ms at a 128 kHz sampling rate, so 1024 samples are collected for each echo. A plot of the first part of the pulse sequence was shown in FIG. 4.

The reconstruction is performed by a known gridding reconstruction. Image reconstruction takes about 5 seconds, and is completely integrated into the Signa software. This seamless integration will be extremely important for clinical applications. As in conventional RARE, the effective echo time is determined by the time at which the low spatial frequency data is collected. In the RARE-spiral pulse sequence the order of the spiral segments can be permuted to achieve a particular effective echo time and k-space weighting. In addition, each segment can be played in either direction.

This provides considerable latitude in designing smooth k-space weighting functions.

Figure 10A:
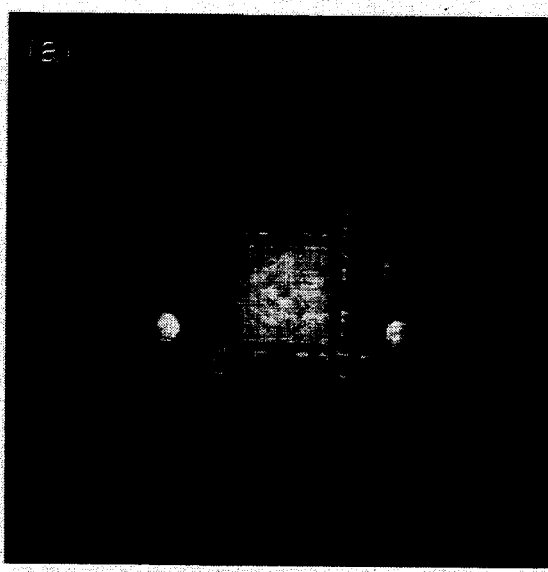
FIGS. 10A and 10B are images of phantoms on resonance and at 64 Hz above resonance.
Figure 10B:
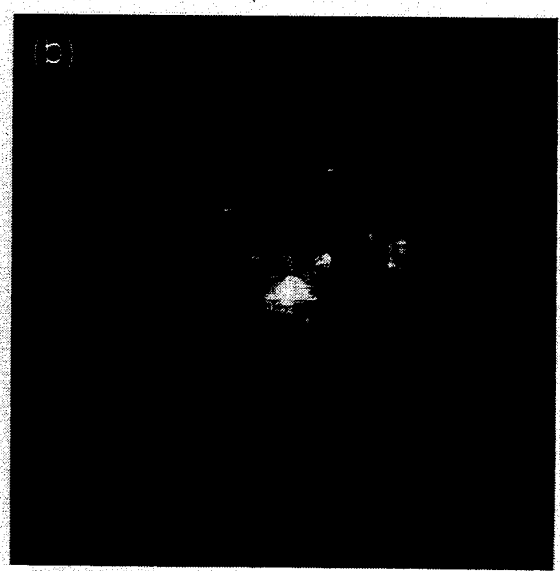
Figure 11A:
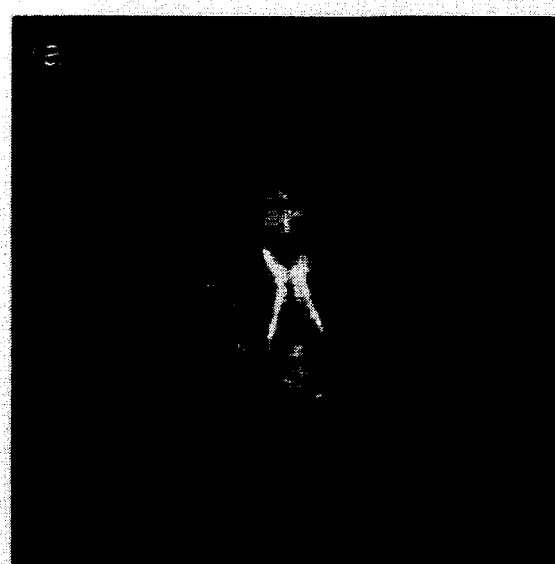
FIGS. 11A–11D illustrate head slice images with effective echo times of 16 ms, 80 ms, 112 ms, and 256 ms, respectively.
Figure 11B:
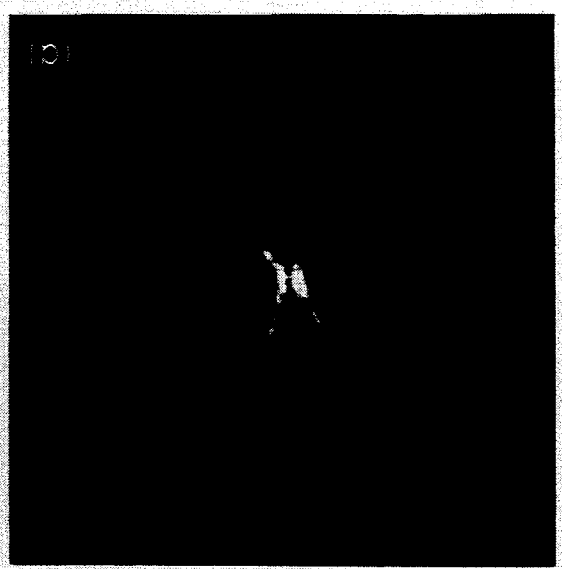
Figure 11C:
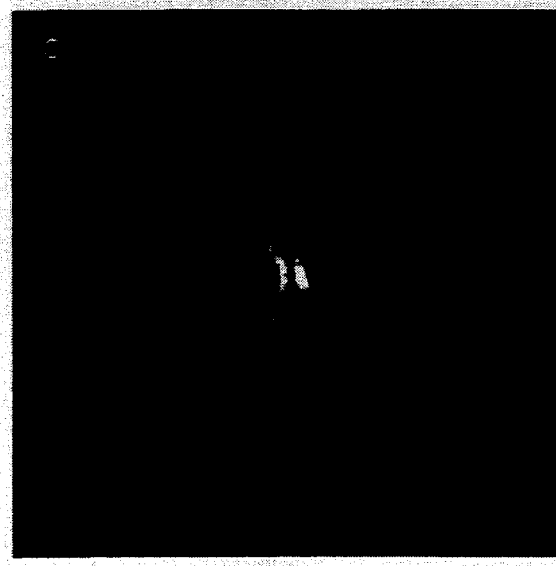
Figure 11D:
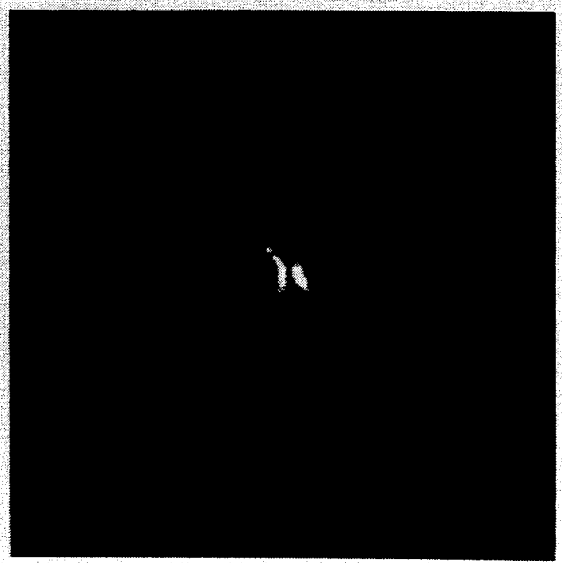

An image of a resolution phantom is shown in FIG. 10A. The FOV is 36 cm, and the slice thickness is 1 cm. The spiral segments were all collected in order starting at the middle, so the effective echo time is 15 ms. The effect of off-resonance blurring is shown in FIG. 10B. Here the transmitter and receiver were set 1 ppm, or 64 Hz, above resonance. Note that the identifiable features are always reconstructed at the correct location. The effect of off-resonance is the reduce the intensity of the primary image and put the energy into a diffuse haze.

Images of a normal volunteer are shown in FIG. 11A–11D. The FOV is 32 cm and the slice thickness is 1 cm. Effective echo times are 16 ms, 80 ms, 112 ms, and 256 ms. Note the off-resonance effects at the front of the skull due to the presence of air in sinuses.

The RARE-spiral pulse sequence we have been considering so far collects the data for an entire 32 cm field of view, 128 by 128 image using a single 256 ms CPMG echo train. If we want an image with higher resolution we have to further lengthen the echo train to acquire the additional data. This impractical because only the very long $T_2$ species are still producing signal beyond 256 ms. In order to collect the additional data we need to use additional CPMG echo trains. These are separated by several seconds to allow full magnetization recovery. For example, to collect the data for a 24 cm field of view, 256 by 256 image we would need a single echo train of 1024 ms, using a total of 64 echoes. This would give an image resolution of about 1 mm. If we use four echo trains each echo train is again 256 ms, as in the single shot case.

There are two ways we can design k-space trajectories for multiple echo trains. The first is simply to take the 64 segments and assign them to the separate echo trains in a way that minimizes rapid variations in the $T_2$ data weighting. One method would be to assign every fourth segment to each echo train. After all four echo trains have been acquired, data for all 64 k-space rings have been collected.

The other method is to combine interleaving with the annular rings. In this case we start with a single shot RARE-spiral trajectory that has the desired resolution, but has much too small a field of view (due to its low sampling density). This RARE-spiral is repeated over a uniform set of rotation angles (interleaved) to increase the sampling density, and hence the field of view. For the example above, the single shot RARE-spiral would have a resolution of 1 mm, but a field of view of only 6 cm. If we acquire a second data set with the k-space trajectory rotated by 180 degrees the resolution stays at 1 mm, but we can now reconstruct a field of view of 12 cm. Acquiring third and fourth data sets with the k-space trajectory rotated by 90 and 270 degrees, respectively, we can reconstruct the full 24 cm field of view at the desired 1 mm resolution.

Each of these two methods have advantages. The method using all annular rings will be less susceptible to artifacts from motion, non-steady state fluctuations, and other sources of signal variation. The interleaved annular ring method is easier to program, and allows the field of view to be easily varied.

In conclusion, by combining the k-space scanning efficiency of spirals with the long echo trains attainable with RARE, it is possible to design a sequence that can produce single shot 128 by 128 images on a stock whole body scanner. While the invention has been described with reference to specific embodiments, the description is illustrative of the invention and is not to be construed as limiting the invention. Various applications and modifications may occur to those skilled in the art without departing from the true scope and spirit of the invention as defined by the appended claims.

What is claimed is:

1. A method of detecting magnetic resonance signals from an object comprising the steps of
   a) placing said object in a magnetic field aligned along a first axis,
   b) applying an RF excitation pulse train to said object at an angle to said first axis to excite nuclei spins in said body, said RF excitation pulse train including a series of excitation refocusing pulses,
   c) providing magnetic readout gradients whereby a k-space spiral is traversed during read-out periods, said k-space spiral being partitioned into a plurality of annular segments with each read-out period corresponding to an annular segment in k-space,
   d) sequentially applying magnetic readout gradients for said annular segments following said excitation refocusing pulses for detection of spin-echo signals from said nuclei spins, and
   e) sequentially detecting said spin-echo signals for said plurality of annular segments in k-space.

2. The method as defined by claim 1 wherein said annular segments are rotated and re-applied in another sequence.

3. The method as defined by claim 1 wherein said sequence begins with an intermediate annular segment.

4. The method as defined by claim 1 wherein each annular segment of said k-space spiral begins at an origin in k-space and moves back to said origin in k-space from the end of said segment.

5. The method as defined by claim 4 wherein the scan of each annular segment from and to said origin in k-space is produced by magnetic gradient lobes at the beginning and at the end of each segment.

6. The method as defined by claim 5 and further including magnetic crusher gradients before and after detecting said spin-echo signals to suppress parasitic pulse-echoes, said magnetic gradient lobes occurring concurrently with said magnetic crusher gradients.

7. The method as defined by claim 1 wherein step (e) detects $T_2$ weighted spin-echo signals.

8. Apparatus for detecting magnetic resonances signals from an object comprising
   a) means for establishing a magnetic field through said object along a first axis,
   b) means for applying an RF excitation pulse train to said object at an angle to said first axis to excite nuclei spins in said body, said RF excitation pulse train including a series of excitation refocusing pulses,
   c) means for providing magnetic readout gradients whereby a k-space spiral is traversed during read-out periods, said k-space spiral being partitioned into a plurality of annular segments with each read-out period corresponding to an annular segment in k-space,
   d) means for sequentially applying magnetic readout gradients for said annular segments following said excitation refocusing pulses for detection of spin-echo signals from said nuclei spins, and
   e) means for sequentially detecting said spin-echo signals for said plurality of annular segments in k-space.

9. Apparatus as defined by claim 8 wherein said annular segments are rotated and re-applied in another sequence.

10. Apparatus as defined by claim 8 wherein said sequence begins with an intermediate annular segment.

11. Apparatus as defined by claim 8 wherein each annular segment of said k-space spiral begins at an origin in k-space and moves back to said origin in k-space from the end of said segment.

12. Apparatus as defined by claim 11 wherein movement of each annular segment from and to said origin in k-space is produced by magnetic gradient lobes at the beginning and at the end of each segment.

13. Apparatus as defined by claim 12 and further including means for applying magnetic crusher gradients before and after detecting said spin-echo signals to suppress parasitic pulse-echoes, said magnetic gradient lobes occurring concurrently with said magnetic crusher gradients.

14. Apparatus as defined by claim 8 wherein element (e) detects $T_2$ weighted spin-echo signals.

* * * * *